United States Patent [19]

Leidich

[11] 4,286,226

[45] Aug. 25, 1981

[54] AMPLIFIER WITH ELECTRICALLY CONTROLLED GAIN, WITH OUTPUT SUITABLE FOR DIRECT COUPLING

[75] Inventor: Arthur J. Leidich, Raritan Township, Somerset County, N.J.

[73] Assignee: RCA Corporation, New York, N.Y.

[21] Appl. No.: 66,335

[22] Filed: Aug. 14, 1979

[51] Int. Cl.$^3$ .......................... H03F 1/30; H03F 3/68
[52] U.S. Cl. .................................... 330/254; 330/261
[58] Field of Search ................................ 330/254, 261

[56] References Cited

U.S. PATENT DOCUMENTS 3,909,738  9/1975  Niimi .................................... 330/254

FOREIGN PATENT DOCUMENTS 2723750 12/1978 Fed. Rep. of Germany ........... 330/254

Primary Examiner—Alfred E. Smith
Assistant Examiner—T. N. Grigsby

Attorney, Agent, or Firm—Allen J. Limberg; Allan J. Jacobson

[57] ABSTRACT

An electrically adjustable current divider means divides the output current of a constant current generator into a plurality of portions, a first of which is applied as tail current to a long-tailed-pair amplifier connection of transistors for controlling its voltage gain. At least one of the long-tailed-pair transistors has a resistive load; the quiescent value of the output voltage developed across this load has an undesirable tendency to exhibit shifts as gain is controlled. A second portion of divided output current from the constant current generator, exhibiting changes in magnitude complementary to those exhibited by the first portion, is applied to current-to-voltage converter means for developing voltage components to counteract the above-mentioned tendency towards shifts in the quiescent value of the output voltage as gain is controlled.

9 Claims, 7 Drawing Figures

AMPLIFIER WITH ELECTRICALLY CONTROLLED GAIN, WITH OUTPUT SUITABLE FOR DIRECT COUPLING

The Government has rights in this invention pursuant to Martin Marietta PO#2GD-692020 with RCA, under Prime Contract DAAA09-76-C-2001, awarded by the Department of Defense (Army).

The present invention relates to electrically controlling the gain of a long tailed pair with resistive load by adjusting its tail current and, more particularly, to improved controlled gain amplifier circuitry in which the shift in quiescent voltage across the resistive load, arising from gain control, is compensated for at the output signal terminal.

This is desirable to do when the output of the long tailed pair is to be direct-coupled to an ensuing amplifier stage. Such reliance on direct coupling is necessary in certain monolithic integrated circuit designs as pointed out by L. A. Harwood in his U.S. Pat. No. 3,430,154 patented Feb. 25, 1969 and entitled "CIRCUIT FOR STABILIZING THE DC OUTPUT VOLTAGE OF A GAIN CONTROLLED AMPLIFIER STAGE IN A DIRECT COUPLED INTEGRATED CIRCUIT SIGNAL TRANSLATING SYSTEM." In Harwood's circuit the mechanism for controlling the gain of bipolar transistors in long-tailed-pair connection is the application of direct potential between their base electrodes to shift an increased portion of the tail current flow through the interconnection of their emitters to one of the transistors. The increased current flow through this transistor increases its transconductance but little, compared to the decreased current flow through the other transistor decreasing its transconductance. Since the voltage gain of a long-tailed pair is proportional to its output load resistance times the product of the transconductances of its component transistors divided by the sum of those transconductances, the voltage gain is reduced. This type of gain control for the long-tailed pair results in its transfer characteristic becoming unsymmetrical with reduction in gain, tending to cause envelope distortion in amplifiers handling amplitude modulated signals and tending to impair AM rejection in amplifiers handling frequency modulated signals.

The present invention is embodied in an amplifier in which this undesirable asymmetry of transfer characteristic is avoided by controlling the gain of a long tailed pair through adjustment of its tail current. An electrically adjustable current divider means is used to furnish a first current and at least one further current, each of which varies in inverse relationship to the first current with adjustment. The first current is used as tail current for the long tailed pair. Each further current is converted to a voltage augmenting the voltage otherwise appearing across a resistive load of the long-tailed pair, to provide for a constant quiescent potential on which to superimpose an output signal.

Figure 1:
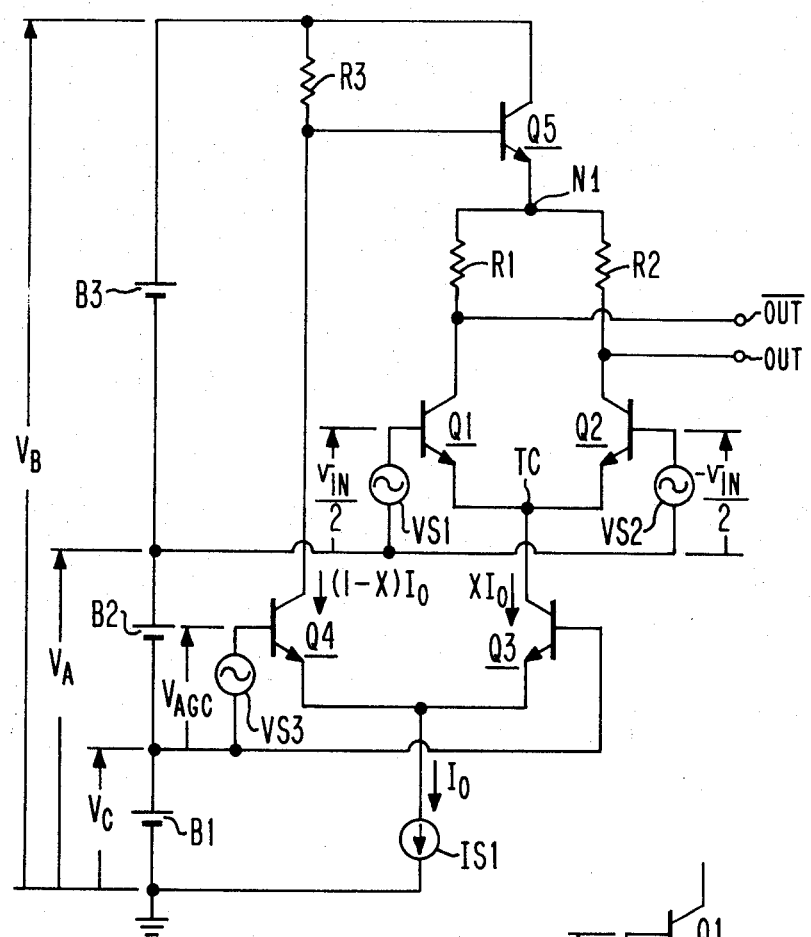
FIGS. 1, 5 and 7 are schematic diagrams of gain-controlled amplifiers which embody the present invention.
Figure 2:
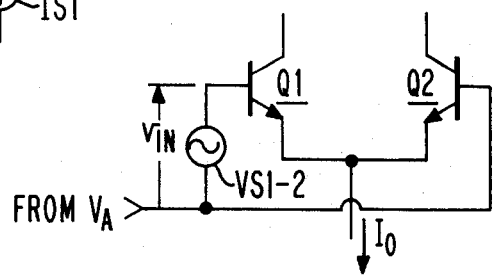
FIG. 2 is a schematic diagram of an alternative way to apply input signals to these amplifiers.

In FIG. 1 NPN transistors Q1 and Q2 are in long-tailed pair connection, a tail current of value $xI_O$ being withdrawn from the tail connection TC between their emitter electrodes. A direct bias voltage $V_A$ is applied to their respective base electrodes, with a voltage source VS1 being connected to superimpose an input signal $(v_{IN})/2$ on the bias voltage applied to the base of Q1, and with a voltage source VS2 being connected to superimpose an input signal $-(v_{IN})/2$ on the bias voltage applied to the base of Q2. These balanced drive voltages may be provided, for example, from the ends of a coupling transformer winding with center tap connection to which $V_A$ is applied. In practice it is usually desirable to shift input signal ground (at $V_A$) to the base electrode of one of the transistors as shown in FIG. 2, where $V_A$ is applied directly to the base of Q2 and a single-ended input signal voltage $v_{IN}$ provided by voltage source VS1-2 is superimposed on $V_A$ for application to the base of Q1. This permits the use of a coupling transformer without center-tapped secondary winding, for example, or alternatively facilitates the use of direct or resistive coupling from a preceding amplifier with single-ended output drive.

Referring back to FIG. 1, Q1 and Q2 are provided resistive collector loads by resistors R1 and R2, respectively, which connect their respective collector electrodes to a node N1 to which an adjustable operating voltage is applied, as explained in greater detail below. R1 and R2 have resistances of $R_1$ and $R_2$, respectively. The superposition Theorem and the balanced nature of the $(v_{IN})/2$ and $-(v_{IN})/2$ input signal voltages applied to the bases of Q1 and Q2 permits one to observe that the tail connection TC between their emitter electrodes is at a virtual ground for signal. So the collector current variations $i_{C-Q1}$ of Q1 are equal to its transconductance $g_{m-Q1}$ times $(v_{IN}/2)$, causing by Ohm's Law a potential $v_{\overline{OUT}} = -(g_{m-Q1})(v_{IN}/2)(R_1)$ across R1. This output signal $v_{OUT}$ appears then, between node N1 at one end of R1 and an output terminal $\overline{OUT}$ connected from the other end of R1, to which the collector of Q1 connects. The collector current variations $i_{C-Q2}$ of Q2 are equal to its transconductance $g_{m-Q2}$ times $-(v_{IN}/2)$, causing a potential drop $v_{OUT} = (g_{m-Q2})(v_{IN}/2)(R_2)$ across R2. This signal appears between node N1 at one end of R2 and an output terminal $\overline{OUT}$ connected from the other end of R2, to which the collector of Q2 connects.

Where balanced output signals are required, R1 and R2 will generally have resistances $R_1$ and $R_2$ of the same value $R_L$ and transistors Q1 and Q2 will be matching transistors so their transconductances $g_{m-Q1}$ and $g_{m-Q2}$ are alike. Such construction will be presumed in the ensuing description of FIG. 1. Where single-ended output signal is all that is required, the unused output terminal can be connected to node N1 directly without substantial intervening resistance, to save a resistor.

Voltage gain is controlled by concurrently adjusting the values of $g_{m-Q1}$ and $g_{m-Q2}$. It is well known that the transconductance of a bipolar transistor varies linearly with the value of current flowing through its principal current conduction path, between its collector and emitter electrodes. (Variation of the transconductance of a field effect transistor varies with the value of current through its principal current conduction path, between its drain and source electrodes, though not linearly.) Gain-controlled amplifiers embodying the present invention adjust the currents flowing through the principal current conduction paths of the long-tailed-pair amplifier transistors by adjusting the sum of those currents—i.e. the tail current.

More particularly, a tail current $xI_O$, where x is an adjustable scaling factor in a range between one and zero and $I_O$ is a constant value of current, is withdrawn from tail connection TC between the emitter electrodes of Q1 and Q2 in the FIG. 1 circuit. This $xI_O$ current flow is arranged responsive to the collector current demand of an NPN transistor Q3 arranged for operation as a constant current source, the value of which constant current is adjustable as explained in detail later in this specification. Since the supplying of the tail current $xI_O$ (withdrawn from tail connection TC) is apportioned as quiescent emitter currents of value $(\frac{1}{2})(xI_O)$ between Q1 and Q2, the common-base-amplifier actions of Q1 and Q2 will couple similar valued quiescent collector currents to their collector load resistors R1 and R2 to cause quiescent voltage drops of $xI_OR_L/2$ across each of them, in accordance with Ohm's Law. These drops show a linear dependence on the value of the variable x and would cause undesired shifts in the value of the quiescent voltages at the OUT and $\overline{OUT}$ terminals with the adjustment of x if operating potential, such as $V_B$, were applied directly to node N1. In the FIG. 1 circuit a direct voltage which exhibits a complementary shift in value to the quiescent voltage drops across R1 and R2 as x is changed—rather than a constant voltage—is applied between node N1 and a fixed operating voltage $V_B$, so the quiescent voltages at the OUT and $\overline{OUT}$ terminals do not shift as x is adjusted. Towards achieving this goal, a further source of current changing in complementary fashion to $xI_O$ is provided by NPN transistor Q4; this current is applied to current-to-voltage converter means to generate a voltage with complementary shift to the drops across R1 and R2 for offsetting node N1 from the $V_B$ operating potential. More particularly, the current-to-voltage converter (VIC) means is shown in FIG. 1 as comprising, firstly, a resistor R3 with $V_B$ applied to a first of its two ends and with the collector current of Q4 withdrawn from the second of its ends and, secondly, a potential follower provided by common-collector-amplifier NPN transistor Q5 for applying a potential to node N1 following that at the second end of R3. The potential follower buffers the VIC means from the changing collector current flows of Q1 and Q2 applied to node N1 via R1 and R2, respectively, so the voltage drop across R3 is essentially determined only by the collector current of Q4.

The complementary changes in the collector currents of Q3 and Q4 are achieved in the FIG. 1 gain-controlled amplifier by connecting them in current splitting configuration with constant current generator IS1 connected to withdraw a prescribed current $I_O$ from their interconnected emitter electrodes. The relative values of the currents flowing from collector-to-emitter in each of the transistors Q3 and Q4 is governed by the value of the gain control voltage $V_{AGC}$ applied between their base electrodes by voltage source VS3, as known to those skilled in the art. Assuming the base currents of Q3 and Q4 negligibly small respective to their collector currents—a fair assumption for modern transistors which customarily have common-emitter forward current gains of 30 or more—the collector current flow of each of these transistors will essentially be of the same strength as its emitter current flow. The emitter current of Q3, like its collector current, is presumed to be of value $xI_O$, x depending upon the value of $V_{AGC}$. The emitter current of Q4 must then be substantially equal to $(1-x)I_O$ in order to meet the demand for combined emitter currents equal to $I_O$ placed on Q3 and Q4 by constant current generator IS, in accordance with Kirchoff's Law of Currents. So, the collector current of Q4 will be substantially equal to $(1-x)I_O$. By making resistor R3 have a resistance $R_3$ equal to $(R_L/2)$, the voltage drop thereacross attributable to the $(1-x)I_O$ collector current of Q4 will be Ohm's Law have a value $(1-x)I_OR_L/2$.

This places the base of Q5 at a potential $V_{B-[(1-x)I_OR_L/2]}$, responsive to which its emitter at node N1 is at a potential $V_b-[(1-x)I_OR_L/2]-V_{BEQ5}$, $V_{BEQ5}$ being the relatively fixed emitter-to-base offset potential of Q5. The terminals OUT and $\overline{OUT}$ are then at quiescent potentials each equal to $V_B-[(1-x)I_OR_L/2]-V_{BEQ5}-(xI_OR_L/2)=V_B-(I_OR_L/2)-V_{BEQ5}$ and thus essentially independent of x.

There will, of course, be a distinctly second order dependency on x since $V_{BEQ5}$ depends logarithmically on the emitter current of Q5, which essentially equals the sum of the collector currents of Q1 and Q2 and thus essentially equals $xI_O$. This dependency can be reduced by withdrawing further emitter current flow from Q5, preferably by a shunt regulating element the conduction of which is controlled by sensing the departure of the collector current of Q5 from prescribed value.

A few details of the biasing of the FIG. 1 circuit remain to be described. Voltage $V_C$ exceeding the emitter-to-base offset potentials of Q3 and Q4 is shown applied directly to the base of Q3 and indirectly via voltage source VS3 to the base of Q4. Decreasingly negative or increasingly positive values of $V_{AGC}$ tend to increase $(1-x)I_O$ at the expense of reducing $xI_O$, reducing the tail current withdrawn from tail connection TC and thus the signal voltage gain exhibited by the long-tailed-pair connection of Q1 and Q2. Decreasingly positive or increasingly negative $V_{AGC}$ will, on the other hand, increase $xI_O$ at the expense of reducing $(1-x)I_O$; and the increased tail current demand at connection TC will increase the signal voltage gain exhibited by the long-tailed-pair connection of Q1 and Q2.

Figure 3:
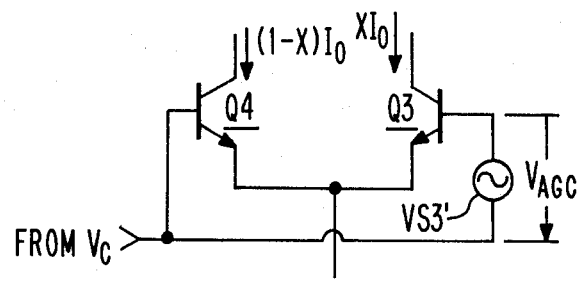
FIG. 3 is a schematic diagram of an alternative way to apply gain control voltage to the FIG. 1 amplifier.

A voltage source VS3' supplying a control voltage varying counter to that supplied by VS3—as may be the most readily available control voltage in an AGC system, for example—is accommodated by connection between $V_C$ and the base of Q3 as shown in FIGS. 3, rather than between $V_C$ and the base of Q4 as VS3 is in FIG. 1.

In FIG. 1 $V_C$ is shown being supplied by battery B1; $V_A$ is shown being supplied by batteries B1 and B2 in series-aiding connection; and $V_B$ is shown being supplied by batteries B1, B2, and B3 in series-aiding connection. Alternatively, as is obvious to one skilled in the art, $V_A$ and $V_C$ can be developed from $V_B$ by voltage-division.

Current source IS1 can be proveded by an NPN transistor with collector electrode connection to the interconnection between the emitter electrodes of Q3 and Q4, with emitter electrode connected to ground, and with an appropriate bias potential applied to its base electrode. This NPN transistor may be in the output circuitry of a current mirror amplifier (CMA). If the input to the CMA is a fixed current, $I_O$ will be invariant, causing the quiescent voltages at terminals $\overline{OUT}$ and OUT to be at constant offsets from $V_B$. Arranging the input current to the CMA to be proportional to $V_B$ less an offset potential will, if the constant of proportionality is properly chosen, result in $I_O$ changing with $V_B$ so as to maintain terminals $\overline{\text{OUT}}$ and OUT at constant offsets from ground.

Figure 4:
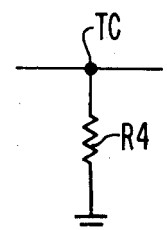
FIG. 4 is a schematic diagram of a modification to the amplifiers of FIGS. 1, 5 and 7 when they are used in automatic gain control (AGC) systems to avoid a possibility of AGC lock-out.

It may be desired in an AGC system to limit the amount by which the voltage gain of the long-tailed-pair connection of Q1 and Q2 can be reduced, in order to avoid AGC lock-out problems. This is readily accomplished by providing for an alternate path for current from tail connection TC to ground—i.e. via a resistor R4 as shown in FIG. 4.

Figure 5:
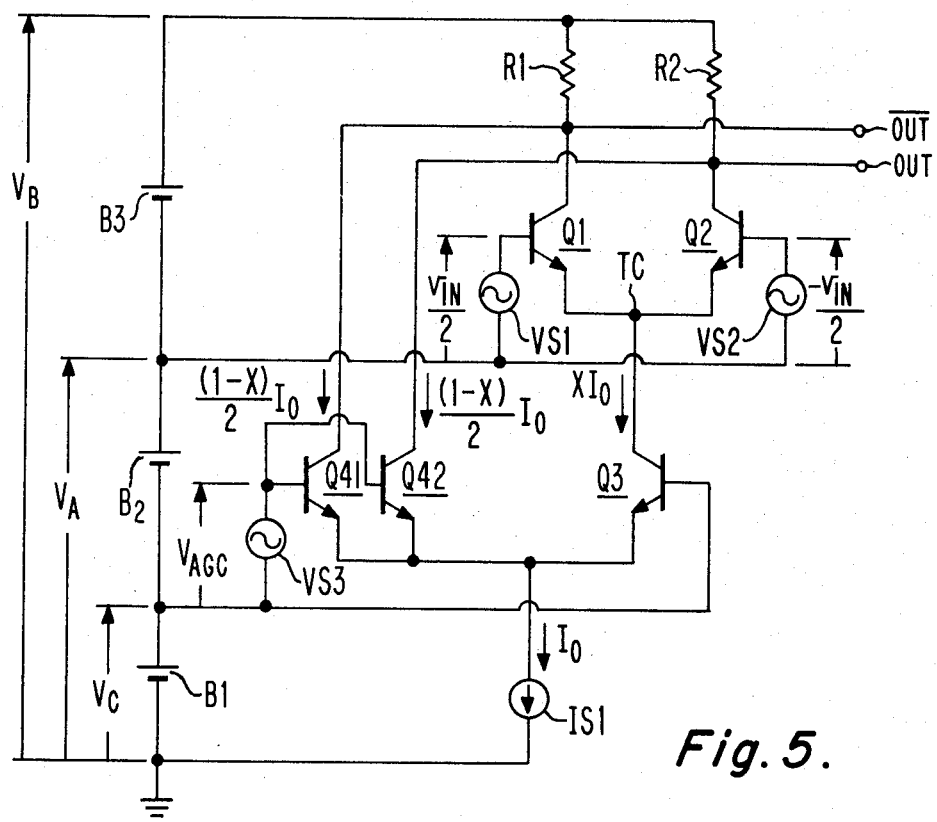

FIG. 5 shows how to eliminate R3 and Q5, if desired. Eliminating R3 saves die area in a monolithic integrated circuit construction, and eliminating Q5 obviates the problem of $V_{BEQ5}$ modulation by changes in $xI_O$. The node N1 connection between R1 and R2 is replaced by connection to $V_B$ bus. Q4 is replaced by matched transistors Q41 and Q42, their parallelled base-emitter junctions replacing the base-emitter junction of Q4 to apportion the $(1-x)I_O$ current that flowed as emitter current in Q4 equally between them as their emitter currents. The $(1-x)I_O/2$ collector currents Q41 and Q42 demand are applied in parallel with the $xI_O/2$ collector currents demanded by Q1 and Q2, respectively, to the ends of R1 and R2, respectively, remote from the ends at $V_B$ potential. So quiescent currents of $I_O/2$ value flow through each of the resistors R1 and R2 to place the terminals OUT and $\overline{\text{OUT}}$ at quiescent voltages of $V_B-(I_OR_L/2)$, irrespective of the value of x.

Figure 6:
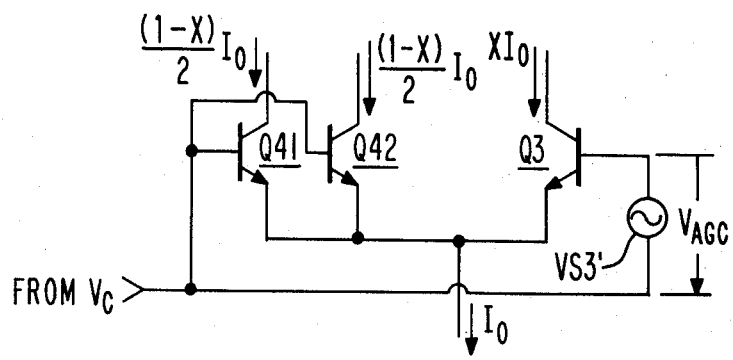
FIG. 6 is a schematic diagram of an alternative way to apply gain control voltage to the FIG. 5 or FIG. 7 amplifier.
Figure 7:
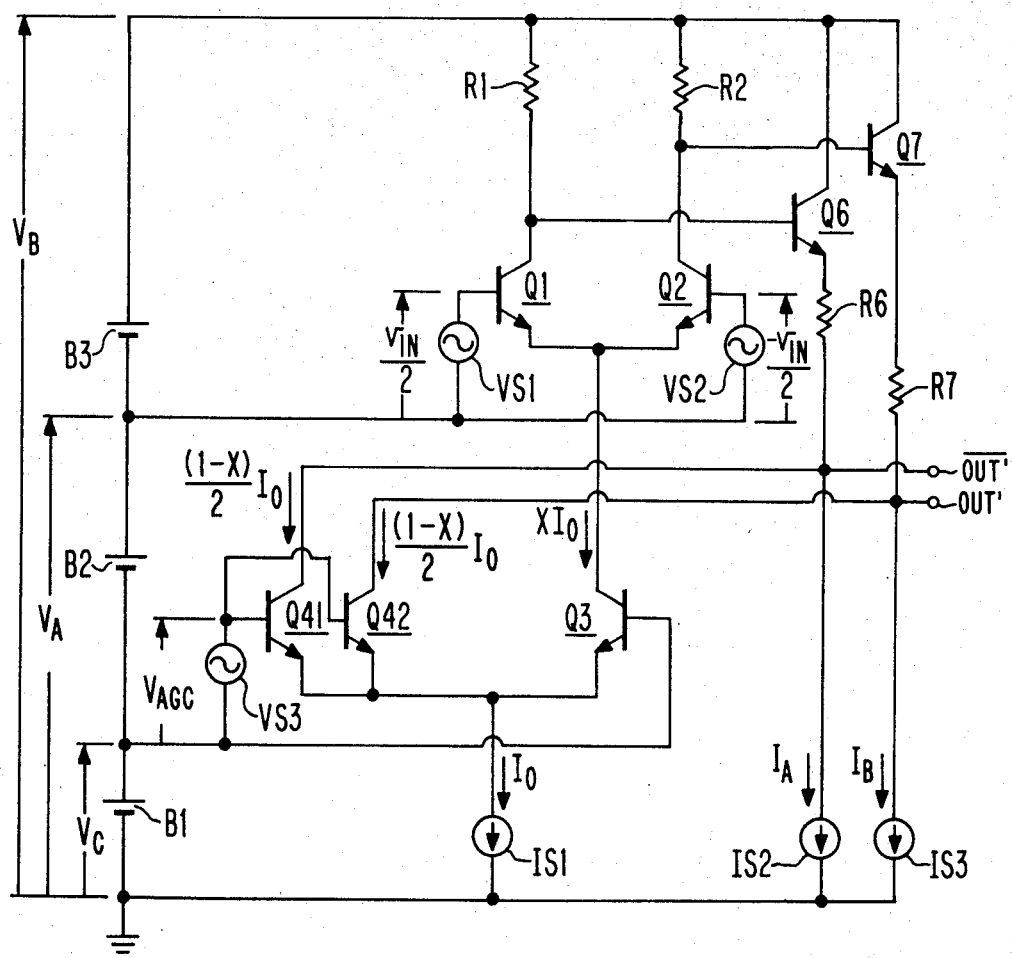

FIG. 6 shows how a gain control voltage source VS3' may be accommodated in the FIG. 5 gain-controlled amplifier just described or in the FIG. 7 gain-controlled amplifier now to be described.

FIG. 7 shows an embodiment of the invention particularly useful in applications where it is desired to translate the controlled-gain amplifier output voltages at terminals $\overline{\text{OUT}}'$ and OUT' to obtain quiescent values of them offset from $V_A$ in the direction towards ground. The first ends of R1 and R2 again connect to receive $V_B$ potential, with their second ends receptive of the collector currents of Q1 and Q2, respectively. The balanced, amplified $v_{IN}$ signals at the second ends of R1 and R2 are superimposed on quiescent voltages equal to $V_B-(xI_O/2)R_L$ and are applied to the inputs of respective potential followers. These potential followers are shown as comprising common-collector amplifier NPN transistors Q6 and Q7, respectively, which have quiescent emitter voltages of $V_B-(xI_O/2)R_L-V_{BEQ6}$ and $V_B-(xI_O/2)R_L-V_{BEQ7}$, respectively, $V_{BEQ6}$ and $V_{BEQ7}$ being the emitter-to-base offset voltages of Q6 and Q7, respectively. The outputs of these followers at the emitter electrodes of transistors Q6 and Q7, respectively, connect to the first ends of resistors R6 and R7, respectively. The resistors R6 and R7 have respective resistances $R_6$ and $R_7$ each of value $R_L$. The second end of R6 has the current $I_A$ from a constant current source IS2 plus the $(1-x)I_O/2$ collector current of Q41 drawn through it to cause a voltage drop across R6 of value $[I_A+(1-x)I_O/2]R_L$. The second end of R7 has the current $I_B$ from a constant current source IS3 plus the $(1-x)I_O/2$ collector current of Q42 drawn through it to cause a voltage drop across R6 of value $[I_B+(1-x)I_O/2]R_L$. So, output terminals $\overline{\text{OUT}}$ and OUT' at the second ends of R6 and R7, respectively, have quiescent voltages at them of $V_B-V_{BEQ6}-[I_A+(I_O/2)]R_L$ and of $V_B-V_{BEQ7}-[I_B+(I_O/2)]R_L$ respectively, which exhibit no substantial dependence on the value of x, only the second-order effect of the modulation of $V_{BEQ6}$ and $V_{BEQ7}$ with change in the $(1-x)I_O/2$ collector currents of Q41 and Q42. As noted before, the potential followers can be modified to substantially reduce or even eliminate these second-order effects. The values of $I_A$ and $I_B$ can be selected to translate the output voltages at terminals $\overline{\text{OUT}}'$ and OUT' to quiescent values as close to ground as desired. Means for maintaining constant offset potentials across themselves may be inserted in series with R6 and with R7 if wished—e.g., diodes or series connections of them, operated in forward or reverse (avalanche) conduction.

One skilled in the art and armed with the foregoing disclosure will be readily able to generate without undue experimentation embodiments of the invention other than those particularly described and the scope of the broader of the following claims should be construed accordingly. In particular, modifications can be made by scaling currents and resistances of resistors differently than described; degeneration resistances may be introduced into the long-tailed pair connections of Q1 and Q2; embodiments using field effect transistors rather than bipolar transistors are possible; and, of course, embodiments using transistors of opposite conductivity type to those shown are possible with suitable modifications of supply voltage potentials. Voltage sources VS1 and VS2 may include semiconductor junction devices for converting linear input current drives to logarithmically related $v_{IN}/2$ and $-v_{IN}/2$ voltages for linearizing the gain of the long-tailed-pair connection of Q1 and Q2 over a wider range of input voltages. Q41 and Q42 may be replaced by a single plural-collector transistor. In the claims which follow the input, output and collector electrodes of a transistor will correspond respectively to its base, collector, and emitter electrodes if it be of bipolar type and to its gate, drain ans source electrodes if it be of field effect type.

What I claim is:

1. An amplifier with electrically controlled gain, comprising:

first and second transistors arranged in long tailed pair connection, with a resistive load of resistance $R_L$ to which the output electrode of the first transistor connects, means for applying input signal between their respective input electrodes for causing an output signal across said resistive load, and a tail connection between the common electrodes of said first and second transistors;

constant current generator means for generating a current of magnitude $I_O$;

third and fourth transistors arranged in adjustable current splitter configuration with the current of magnitude $I_O$ flowing through an interconnection between their common electrodes, provision being made for a control voltage being applied between their input electrodes, the current from the output electrode of said third transistor being applied to said tail connection between the common electrodes of said first and second transistors and having a value $xI_O$, with x of a value depending on said control voltage and lying in a range between zero and unity (whereby the quiescent voltage across said resistive load has a component that changes proportional to x equalling $xI_OR_L/2$), and the current from the output electrode of said fourth transistor changing proportional to $(1-x)I_O$;

current-to-voltage converter means responsive to said current changing proportional to $(1-x)I_O$ providing a voltage component proportional to $(1-x)I_O$ by such scaling factor that the voltage substantially equals $(1-x)I_O R_L/2$, wherein said current-to-voltage converter means includes an auxiliary resistor and means for applying said current changing proportional to $(1-x)I_O$ to said auxiliary resistor to develop thereacross said voltage substantially equal to $(1-x)I_O R_L/2$; and means for summing the voltage component appearing across said resistive load that changes proportional to x together with said voltage component proportional to $(1-x)I_O$ to obtain an output voltage wherein output signal is superimposed on a quiescent voltage that does not substantially change due to change in x.

2. An amplifier in accordance with claim 1 wherein said summing means comprises a fifth transistor, having emitter, base and collector electrodes, the base electrode thereof being connected to the interconnection of said auxiliary resistor and the output electrode of said fourth transistor, the collector electrode thereof being connected to a source of operating potential, and the emitter electrode thereof being connected to the other end of said resistive load.

3. An amplifier in accordance with claim 1 wherein said summing means comprises a fifth transistor having emitter, base, and collector electrodes, the base electrode thereof being connected to the interconnection of said resistive load and the output electrode of said first transistor, the collector electrode thereof being connected to a source of operating potential, and the emitter electrode thereof being connected to the other end of said auxiliary resistor.

4. An amplifier with electrically controlled gain, comprising:
   first and second supply terminals for receiving first and second operating voltages, respectively;
   a third supply terminal for receiving a third operating voltage, intermediate to said first and second operating voltages;
   a fourth supply terminal for receiving a fourth operating voltage intermediate to said first and third operating voltages;
   first, second, third, and fourth transistors, each having respective output and common electrodes defining the ends of its principal current conduction path and having a respective input electrode, the flow of current through its principal current conduction path being controlled by potential between its common and input electrodes;
   a first output signal terminal to which the output electrode of said first transistor connects;
   first connection means between said third terminal and the input elecrode of said first transistor for biasing the input electrode of said first transistor with said third operating voltage,
   second connection means between said third terminal and the input electrode of said second transistor for biasing the input electrode of said second transistor with said third operating voltage, and
   means for applying an input signal voltage between the input electrodes of said first and second transistors included in at least one of said first and second connection means;
   third connection means between said fourth terminal and the input electrode of said third transistor for biasing the input electrode of said third transistor with said fourth operating potential,
   fourth connection means between said fourth terminal and the input electrode of said fourth transistor for biasing the input electrode of said fourth transistor with said fourth operating potential, and
   means for applying a gain control voltage between the input electrodes of said third and fourth transistors included in at least one of said third and fourth connection means;
   an intercommection between the common electrodes of said first and second transistors to which the output electrode of said third transistor connects;
   means for connecting the ouput electrode of said second transistor to said second supply terminal;
   constant current source means connecting said first supply terminal to an interconnection between the common electrodes of said third and fourth transistors;
   potential follower means having input and output connections;
   a first load resistance with a first end connected to the output connection of said potential follower means and with a second end connected to said first output signal terminal; and
   a further, auxiliary resistance with a first end at said second supply terminal, with a second end at the input connection of said potential follower means to which the output electrode of said fourth transistor connects, and of a value respective to said load resistance for stabilizing the quiescent voltage at said first output signal terminal to a value independent of said gain control voltage.

5. An amplifier with electrically controlled gain as set forth in claim 4 wherein the output electrode of said second transistor connects to a second output signal terminal, and wherein said means for connecting the output electrode of said second transistor to said second supply terminal comprises a second load resitance with a first end connected to the output connection of said potential follower means and with a second end connected to said second output signal terminal.

6. An amplifier with electrically controlled gain, comprising:
   first and second supply terminals for receiving first and second operating voltages, respectively;
   a third supply terminal for receiving a third operating voltage, intermediate to said first and second operating voltages;
   a fourth supply terminal for receiving a fourth operating voltage intermediate to said first and third operating voltages;
   first, second, third, fourth, and fifth transistors, each having respective output and common electrodes defining the ends of its principal current conduction path and having a respective input electrode, the flow of current through its principal curent conduction path being controlled by potential between its common and input electrodes;
   a first output signal terminal to which the output electrodes of said first and fourth transistors connect;
   a first connection means between said third terminal and the input electrode of said first transistor for biasing the input electrode of said first transistor with said third operating voltage,
   second connection means between said third terminal and the input electrode of said second transistor for biasing the input electrode of said second transistor with said third operating voltage, and means for applying an input signal voltage between the input electrodes of said first and second transistors included in at least one of said first and second connection means;

third connection means between said fourth terminal and the input electrode of said third transistor for biasing the input electrode of said third transistor with said fourth operating potential, fourth connection means between said fourth terminal and the input electrodes of said fourth and fifth transistors for biasing the input electrodes of said fourth and fifth transistors with said fourth operating potential, and means for applying a gain control voltage between the input electrode of said third transistor and the interconnected input electrodes of said fourth and fifth transistors included in at least one of said third and fourth connection means;

an interconnection between the common electrodes of said first and second transistors to which the output electrode of said third transistor connects;

means for connecting the output electrodes of said second and fifth transistors to said second supply terminal;

constant current source means connecting said first supply terminal to an interconnection between the common electrodes of said third, fourth and fifth transistors; and a first load resistance with a first end connected to said second supply terminal and with a second end connected to said first output signal terminal.

7. An amplifier with electrically controlled gain as set forth in claim 6 wherein the output electrodes of said second and fifth transistors connect to a second output signal terminal, and wherein said means for connecting the output electrodes of said second and fifth transistors to said second supply terminal comprise a second load resistance with a first end connected to said second supply terminal and with a second end connected to said second output signal terminal.

8. An amplifier with electrically controlled gain, comprising:

first and second supply terminals for receiving first and second operating voltages, respectively;

a third supply terminal for receiving a third operating voltage, intermediate to said first and second operating voltages;

a fourth supply terminal for receiving a fourth operating voltage intermediate to said first and third operating voltages;

first, second, third, fourth, and fifth transistors, each having respective output and common electrodes defining the ends of its principal current conduction path and having a respective input electrode, the flow of current through its principal current conduction path being controlled by potential between its common and input electrodes;

a first output signal terminal to which the output electrode of said fourth transistor connects;

first connection means between said third terminal and the input electrode of said first transistor for biasing the input electrode of said first transistor with said third operating voltage, second connection means between said third terminal and the input electrode of said second transistor for biasing the input electrode of said second transistor with said third operating voltage, and means for applying an input signal voltage between the input electrodes of said first and second transistors included in at least one of said first and second connection means;

third connection means between said fourth terminal and the input electrode of said third transistor for biasing the input electrode of said third transistor with said fourth operating potential, fourth connection means between said fourth terminal and the input electrodes of said fourth and fifth transistors for biasing the input electrode of said fourth and fifth transistors with said fourth operating potential, and means for applying a gain control voltage between the input elecrode of said third transistor and the interconnected third electrodes of said fourth and fifth transistors included in at least one of said third and fourth connection means;

an interconnection between the common electrodes of said first and second transistors to which the output electrode of said third transistor connects;

respective means for connecting the output electrodes of said second and first transistors to said second supply terminal;

constant current source means connecting said first supply terminal to an interconnection between the common electrodes of said third, fourth and fifth transistors;

first potential follower means having input and output connections;

a first load resistance with a first end connected to said second supply terminal and with a second end connected to the input connection of said first potential follower means to which the output electrode of said first transistor connects; and a further, first auxiliary resistance with a first end connected to the output connection of said first potential follower means, with a second end connected to said first output signal terminal, and of a value respective to said load resistance for stabilizing the quiescent voltage at said first output signal terminal to a value independent of said gain control voltage.

9. An amplifier with electrically controlled gain as set forth in claim 8 wherein second potential follower means hving input and output connections has the output electrode of said second transistor connected to its input connection; wherein a second load resistance has a first end connected to said second supply terminal, has a second end connected to the input connection of said second potential follower means, and is included in said means for connecting the output electrode of said second transistor to said second supply terminal; and wherein a second auxiliary resistance has a first end connected to the output connection of said second potential follower means, has a second end connected to a second output signal terminal to which the output electrode of said fifth transistor connects.

* * * * *

UNITED STATES PATENT AND TRADEMARK OFFICE
CERTIFICATE OF CORRECTION

PATENT NO. : 4,286,226
DATED : August 25, 1981
INVENTOR(S) : Arthur John Leidich It is certified that error appears in the above—identified patent and that said Letters Patent is hereby corrected as shown below:

Column 2, line 12, change "$v_{IN}$" to --$\underline{v}_{IN}$--.

line 14, change "$v_{IN}$" to --$\underline{v}_{IN}$--.

line 22, change "$v_{IN}$" to --$\underline{v}_{IN}$--.

line 36, change "$v_{IN}$" to --$\underline{v}_{IN}$-- (two occurrences).

line 40, change "$i_{C}$" to --$\underline{i}_{C}$--.

line 41, change "$v_{IN}$" to --$\underline{v}_{IN}$--.

line 42, change "$v_{\overline{OUT}}$" to --$\underline{v}_{\overline{OUT}}$--.

line 42, change "$v_{IN}$" to --$\underline{v}_{IN}$--.

line 43, change "$v_{OUT}$" to --$\underline{v}_{OUT}$--.

line 47, change "$v_{IN}$" to --$\underline{v}_{IN}$--.

UNITED STATES PATENT AND TRADEMARK OFFICE
CERTIFICATE OF CORRECTION

PATENT NO. : 4,286,226                              Page 2 of 2
DATED       : August 25, 1981
INVENTOR(S) : Arthur John Leidich It is certified that error appears in the above—identified patent and that said Letters Patent is hereby corrected as shown below:

Column 2, line 48, change "$v_{OUT}$" to --$\underline{v}_{OUT}$--.

line 48, change "$v_{IN}$" to --$\underline{v}_{IN}$--.

line 50, change "$\overline{OUT}$" to -- OUT --.

Column 4, line 12, change "be" to --by--.

Column 5, line 44, change "$v_{IN}$" to --$\underline{v}_{IN}$--.

Column 6, line 31, change "$v_{IN}$" to --$\underline{v}_{IN}$-- (two occurrences).

Signed and Sealed this

Sixteenth Day of March 1982

[SEAL]

Attest:

GERALD J. MOSSINGHOFF

*Attesting Officer*    *Commissioner of Patents and Trademarks*